United States Patent [19]

Noren et al.

[11] Patent Number: 5,334,455

[45] Date of Patent: Aug. 2, 1994

[54] FREE-RADICAL CURABLE COMPOSITIONS

[75] Inventors: Gerry K. Noren, Hoffman Estates; John J. Krajewski, Wheeling; Sami A. Shama; John M. Zimmerman, both of Hoffman Estates; Danny C. Thompson, Schaumburg; John T. Vandeberg, Barrington, all of Ill.

[73] Assignee: Stamicarbon B.V., Galeen, Netherlands

[21] Appl. No.: 888,888

[22] Filed: May 26, 1992

Related U.S. Application Data

[63] Continuation-in-part of Ser. No. 647,492, Jan. 28, 1991, abandoned, Ser. No. 647,514, Jan. 28, 1991, abandoned, and Ser. No. 647,460, Jan. 28, 1991, abandoned, which is a continuation-in-part of Ser. No. 436,826, Nov. 15, 1989, abandoned, said Ser. No. 647,492, is a continuation-in-part of Ser. No. 437,374, Nov. 15, 1989, abandoned, said Ser. No. 647,514, is a continuation-in-part of Ser. No. 438,540, Nov. 15, 1989, abandoned, each is a continuation-in-part of Ser. No. 404,578, Sep. 8, 1989, abandoned, which is a continuation-in-part of Ser. No. 319,566, Mar. 7, 1989, abandoned, which is a continuation-in-part of Ser. No. 231,362, Aug. 12, 1988, abandoned.

[51] Int. Cl.$^5$ .................. B32B 27/38; C08F 2/50; C08F 16/32; C08F 22/10
[52] U.S. Cl. .................. 428/413; 428/417; 428/418; 428/480; 428/492; 522/40; 522/41; 522/42; 522/43; 522/44; 522/64; 522/103; 522/179; 522/181; 526/323; 526/332; 526/333

[58] Field of Search .................. 522/93, 97, 96, 174, 522/179, 181, 64, 44, 41, 42, 43, 103; 526/323, 332, 333; 428/413, 417, 418, 480, 492

[56] References Cited

U.S. PATENT DOCUMENTS

| 2,255,313 | 4/1941 | Ellis | 260/42 |
| 3,719,728 | 3/1973 | Mirauda | 522/179 |
| 3,933,935 | 1/1976 | Zachariades et al. | 522/181 |
| 4,112,146 | 7/1978 | Lazear | 428/290 |
| 4,200,762 | 10/1980 | Schmidle | 528/75 |
| 4,447,520 | 2/1984 | Henne et al. | 430/281 |
| 4,552,830 | 8/1985 | Reardon et al. | 430/281 |
| 4,585,828 | 6/1986 | Meixner et al. | 524/604 |
| 4,606,994 | 8/1986 | Illers et al. | 430/281 |
| 4,721,734 | 9/1988 | Gehlhaus et al. | 522/8 |
| 4,749,807 | 12/1988 | Lapin et al. | 521/172 |

FOREIGN PATENT DOCUMENTS 0322808  6/1989  European Pat. Off. .

*Primary Examiner*—Susan W. Berman
*Attorney, Agent, or Firm*—Dressler, Goldsmith, Shore & Milnamow, Ltd.

[57] ABSTRACT

A free-radical radiation curable composition comprising:
  a) at least one compound containing from one to about six vinyl ether groups; and
  b) at least one product obtainable by the reaction of a half-ester of maleic and/or fumaric acid with an epoxy functionalized compound, wherein the ratio of vinyl ether groups to maleate and/or fumarate groups is in the range of about 5:1 to about 1:5.

26 Claims, No Drawings

FREE-RADICAL CURABLE COMPOSITIONS

CROSS-REFERENCE TO RELATED APPLICATIONS

This application is a Continuation-in-Part of U.S. application Ser. No. 647,492, filed Jan. 28, 1991 which is a Continuation-in-Part of U.S. application Ser. No. 437,374, filed Nov. 15, 1989, U.S. application Ser. No. 647,514, filed Jan. 28, 1991, which is a Continuation-in-Part of U.S. application Ser. No. 438,540, filed Nov. 15, 1989, and U.S. application Ser. No. 647,460, filed Jan. 28, 1991, which is a Continuation-in-Part of U.S. application Ser. No. 436,826, filed Nov. 15, 1989, each of which is a Continuation-in-Part of U.S. application Ser. No. 404,578, filed Sep. 8, 1989 which is a Continuation-in-Part of U.S. application Ser. No. 319,566, filed Mar. 7, 1989 which is a Continuation-in-Part of U.S. application Ser. No. 231,362 filed Aug. 12, 1988, all now abandoned.

TECHNICAL FIELD

This invention is directed to free-radical curable compositions that are useful as coatings for various substrates.

BACKGROUND OF THE INVENTION

There are many applications that require a rapidly curable coating composition that adheres to a substrate, is flexible, does not discolor and has low toxicity. For example, optical glass fibers are frequently coated with two superposed coatings. The coating which contacts the glass is a relatively soft, primary coating that must satisfactorily adhere to the fiber and be soft enough to resist microbending especially at low service temperatures. The outer, exposed coating is a much harder, secondary coating that provides the desired resistance to handling forces yet must be flexible enough to enable the coated fiber to withstand repeated bending without cracking the coating.

Other applications, e.g., optical fabrication, coatings for substrates including glass, metal, wood, plastic, rubber, paper, concrete, and fabrics, and adhesives also require compositions that are fast curing, have low toxicity and provide good physical properties.

Compositions that include (meth)acrylate diluents have been utilized for many of these applications. However, (meth)acrylate diluents are hazardous to human health. Therefore, it is desirable to eliminate or reduce the amount of (meth)acrylate diluents present in a composition.

Vinyl ether compositions have been utilized as replacements for (meth)acrylates. Although vinyl ethers rapidly cure when exposed to ultraviolet light in the presence of a cationic curing catalyst, their cure under cationic conditions leaves catalyst residues that discolor the cured compositions and cause them to be sensitive to water. Furthermore, vinyl ether containing oligomers having relatively high equivalent weights, e.g., an equivalent weight in excess of about 500, do not cationically cure upon exposure to dosages of energy less than 3 Joules per square centimeter. Vinyl ethers do not homopolymerize in the presence of free radical initiators. Therefore, vinyl ethers are not suitable replacements for (meth)acrylates.

Unsaturated polyesters, e.g., maleates and fumarates, are known to be substantially non-toxic, but are unsatisfactory as replacements for (meth)acrylates because their rate of cure when exposed to ultraviolet light is not satisfactory for certain applications.

European Patent Application No. 0 322 808 published on 05.07.89 discloses a radiation curable composition that comprises an ethylenically unsaturated polyester component and a vinyl ether component having an average of at least two vinyl ether groups per molecule of the vinyl ether component. The unsaturated polyester component can be a polymer, oligomer or mixture thereof. Coatings produced from this composition are brittle and hard because of the large amount of ethylenically unsaturated groups in the backbone of the polyester component which leads to short chain segments between cross-links. The vinyl ether component reacts with the ethylenically unsaturated group and results in a high degree of cross-linking that causes the cured composition to be brittle, inflexible and hard. Thus, coatings produced from the composition of this European Patent Application do not possess the needed flexibility and softness for applications, such as optical glass fiber coatings, that require a flexible and soft coating.

SUMMARY OF THE INVENTION

This invention is directed to free-radical radiation curable compositions that comprise (1) at least one compound containing from one to about six vinyl ether groups, and (2) at least one product obtainable by the reaction of a half-ester of maleic and/or fumaric acid with an epoxy functionalized compound, wherein the ratio of vinyl ether groups to maleate and/or fumarate groups is in the range of about 5:1 to about 1:5.

These compositions exhibit low toxicity, good cure speeds, good physical properties and are readily synthesized and economical to produce.

The compounds of the present invention can also contain compounds that are represented by the Formula I:

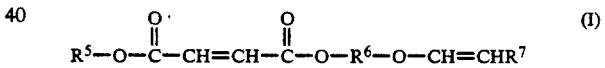

where $R^5$ is hydrogen, alkyl, cycloalkyl, an aryl or alkaryl group with 1 to 10 carbon atoms and at least one optional O or N heteroatom, or a metal ion; $R^6$ is alkyl, cycloalkyl, or an aryl or alkaryl group with 1 to 10 carbon atoms and at least one optional O or N heteroatom; and $R^7$ is hydrogen or methyl.

The compositions of the present invention can, optionally, contain up to about 50% by weight of at least one (meth)acrylate oligomer.

The compositions of the present invention are curable upon exposure to ionizing radiation, actinic energy and heat. The cured compositions exhibit good flexibility, tensile strength, percent elongation and adhesion to substrates. These properties are presently believed to be due to the presence of the epoxy backbones in the compound having maleate and/or fumarate end groups. Prior art coatings produced from materials having maleate/fumarate unsaturated backbones tend to be brittle and hard.

Suitable uses for these flexible compositions include optical glass fiber coatings, paper coatings, leather coatings, wood coatings, concrete coatings, fabric coatings, metal coatings, coatings for the metallization of non-metallic substrates, e.g., plastics, coatings for rubber, optical fabrication, lamination of glass and other materials, i.e., composites, dentistry, prosthetics, adhesives, and the like.

The coatings produced from the present compositions are especially useful as primary and secondary coatings for optical glass fibers because of their adherence to the glass, relatively rapid cure, cure to a relatively fully cured condition without the need for post-curing, flexibility, and resistance to microbending.

Thus, the present invention provides compositions having many properties desired by industry while overcoming the shortcomings of the prior art.

DETAILED DESCRIPTION OF PREFERRED EMBODIMENTS

The present invention is directed to free-radical radiation curable compositions that comprise (1) at least one compound containing from one to about six vinyl ether groups; and (2) at least one product obtainable by the reaction of a half-ester of maleic and/or fumaric acid with an epoxy functionalized compound, wherein the ratio of vinyl ether groups to maleate and/or fumarate groups in the compositions is in the range of about 5:1 to about 1:5, preferably in the range of about 2:1 to about 1:2 and more preferably about 1:1.

Vinyl Ether Compound

The term "vinyl ether" in its various grammatical forms, refers to a vinyl group bound to an oxygen atom which is bound to a carbon atom.

Preferred compounds containing at least one vinyl ether group have the Formula II:

where
m is an integer from 1 to 6;
$R^3$ is a residue of an organic alcohol or polyol, substantially free of maleate or fumarate groups, with a molecular weight of from 56 to about 2000; and
$R^4$ is hydrogen or methyl.

In the most preferred vinyl ether compounds m is 2 to 4.

Preferred vinyl ether compounds are triethylene glycol divinyl ether, commercially available from ISP Corp. under the trade designation Rapi-Cure DVE-3, butane diol divinyl ether, 1,4-cyclohexane dimethanol divinyl ether, octyl vinyl ether, the like, and mixtures thereof.

Other vinyl ether containing compounds can be produced by conventionally reacting a vinyl ether having either a hydroxyl group or amine group with a saturated backbone containing component. The saturated backbone containing component may be the reaction product of saturated hydroxy functional polyesters, polycarbonates, polycaprolactones, polyethers, Bisphenol-A alkoxylates, siloxanes, or polyethers, with organic polyisocyanates, the like and mixtures thereof. The backbone of the vinyl ether containing compound can contain repeating units. The group linking the vinyl ether group to the saturated backbone (linking group) can be a urethane, urea, ester, ether, or thio group and the like. Preferred linking groups are urethane, urea and ester groups. Mixtures of linking groups can be used.

Representative of the vinyl ethers suitable as reactants in the production of the vinyl ether containing oligomer are conventional hydroxy functional vinyl ethers including triethylene glycol monovinyl ether, 1,4-cyclohexane dimethylol monovinyl ether and 4-hydroxy butylvinyl ether.

Representative of the saturated polyesters are the soluble reaction products of saturated polycarboxylic acids, or their anhydrides, and polyols, preferably diols. Suitable saturated polycarboxylic acids and anhydrides include phthalic acid, isophthalic acid, terephthalic acid, trimellitic acid, tetrahydrophthalic acid, hexahydrophthalic acid, tetrachlorophthalic acid, adipic acid, azelaic acid, sebacic acid, succinic acid, glutaric acid, malonic acid, pimelic acid, suberic acid, 2,2-dimethylsuccinic acid, 3,3-dimethylglutaric acid, 2,2-dimethylglutaric acid, the like, anhydrides thereof and mixtures thereof. Suitable polyols include 1,4-butane diol, 1,8-octane diol, trimethylol propane, pentaerythritol, and the like.

Representative of the saturated polycarbonates are polyhexamethylene carbonate (commercially available from PPG Industries under the trade designation Duracarb 120) and polycyclohexane dimethylene carbonate (commercially available from PPG Industries under the trade designation Duracarb 140).

Representative of the saturated polyethers are polyalkylene oxides, alkyl substituted poly(tetrahydrofurans), and copolymers of the alkyl substituted tetrahydrofurans and a cyclic ether.

Representative of the polyalkylene oxides are poly(propylene oxide) (commercially available from Union Carbide under the trade designation Niax PPG 1025) and poly(tetramethylene glycol) (commercially available from DuPont under the trade designation Terathane 1000).

Alkyl substituted tetrahydrofurans have ring structures that open during polymerization to yield the alkyl substituted poly(tetrahydrofurans). The alkyl group of the alkyl substituted poly(tetrahydrofurans) has about 1 to about 4 carbon atoms. Representative of the alkyl substituted poly(tetrahydrofurans) are poly(2-methyltetrahydrofuran) and poly(3-methyltetrahydrofuran). Representative of the cyclic ethers with which the alkyl substituted tetrahydrofurans can be copolymerized are ethylene oxide, propylene oxide, tetrahydrofuran and the like.

Representative of the polycaprolactones are the Tone Polyol series of products, e.g., Tone 0200, 0221, 0301, 0310, 2201, and 2221, commercially available from Union Carbide, New York, N.Y. Tone Polyol 0200, 0221, 2201, and 2221 are difunctional. Tone Polyol 0301 and 0310 are trifunctional.

Representative of the Bisphenol-A alkoxylates are those wherein the hydroxyalkyl group contains about 2 to about 4 carbon atoms, e.g., hydroxyethyl. A commercial Bisphenol-A alkoxylate is the Bisphenol-A diethoxylate available under the trade designation Dianol 22 from Akzo Research, The Netherlands.

Representative of the siloxanes is poly(dimethylsiloxane) commercially available from Dow Corning under the trade designation DC 193.

Suitable vinyl ether compounds can also be prepared by the procedure shown in U.S. Pat. No. 4,996,282.

Further examples of suitable vinyl ether containing compounds are polyvinyl ether polyurethanes and saturated polyesters such as those shown in U.S. Pat. Nos. 4,472,019, 4,749,807, 4,751,273, and 4,775,732.

Further representative vinyl ether containing compounds are obtained by the metathesis of a cyclic olefin ether having the following general Formula III:

$$\begin{array}{c} CR' = CR' \\ | \quad\quad | \\ O—(CR'R')_m \end{array} \quad (III)$$

wherein each $R^I$ individually can be hydrogen or an alkyl, aryl, cycloaliphatic or halogen group and m is a number in the range of about 2 to about 10, preferably about 5 to about 6. Metathesis, which is described in March, *Advanced Organic Chemistry*, Third Edition, copyright 1985 by John Wiley & Sons, Inc., pp 1036–1039 and 1115, results in the opening of the ring of the cyclic olefin ether to produce a vinyl ether containing compound having the following general Formula IV:

$$Z + (CR'R')_m - O - CR' = CR' \overline{)_y} Z \quad (IV)$$

wherein $R^I$ and m are as previously described, y is a number in the range of about 2 to about 50, preferably about 2 to about 25, and each Z is an end group; e.g., hydrogen or a vinyl group. The vinyl ether containing compounds of Formula IV can be blended with the other vinyl ether containing compounds of the present invention or those disclosed in U.S. Pat. Nos. 4,472,019, 4,749,807, 4,751,273, and 4,775,732.

The vinyl ether containing compounds generally have a number average molecular weight of from about 150 to about 8000, preferably from about 150 to about 3000 and most preferably from about 200 to about 2000.

When the compositions of the present invention are utilized as a primary coating for optical glass fiber the equivalent weight of the vinyl ether containing compounds is preferably about 500 to about 1500, more preferably about 800 to about 1200.

When the compositions of the present invention are utilized as a secondary coating for optical glass fiber the equivalent weight of the vinyl ether containing compounds is preferably about 300 to about 1000, more preferably about 400 to about 800.

Epoxy Compound

The epoxy functionalized compound has an epoxy equivalent weight in the range of from about 80 to about 1000, preferably from about 100 to about 700, most preferably from about 150 to about 250. As used herein, the phrase "epoxy equivalent weight" means the number of grams of compound per epoxy group.

The epoxy compound is preferably a glycidyl ether, more preferably a polyglycidyl ether of an aromatic polyol or an aliphatic polyol that has from about 6 to about 100 carbon atoms, preferably from about 10 to about 60 carbon atoms. Representative epoxy functionalized compounds include the diglycidyl ether of hisphenol-A, a polyglycidyl ether of a novolac phenolic or cresol resin, as for example, DEN 431 or DEN 438, available from Dow Chemical Company, and a polyglycidyl ether of an aliphatic polyol having from about 4 to about 10 carbon atoms, as for example, neopentyl diglycidyl ether (ERISYS GE-20) or cyclohexanedimethanol diglycidyl ether (ERISYS GE-22), available from CVC Specialty Chemicals, Inc. The epoxy compounds may also be a cycloaliphatic compound of from 6 to 20 carbon atoms, such as ERL 4221 (available from Union Carbide Co.)

Maleate and/or Fumarate Compound

The maleate or fumarate half ester preferably has the Formula V:

$$CH_3-(CH_2)_x+O-CH_2CHR)_y-O-\overset{O}{\underset{\|}{C}}-CH=CH-\overset{O}{\underset{\|}{C}}-OH \quad (V)$$

where
x is 0 to 5;
y is 0 to 3; and
R is H or methyl.

Generally, the ratio of maleate or fumarate half ester groups to epoxy groups in the composition is in the range of from about 1:2 to about 2:1.

It is well known that maleate groups isomerize to fumarate groups. Therefore, it is likely that a mixture of maleate and fumarate groups will be present in most of these compounds.

Optional (Meth)acrylate Component (Meth)acrylate monomers and oligomers may be used in the compositions of this invention. These (meth)acrylate monomers and oligomers also polymerize by free radical radiation and copolymerize with the other components of the compositions of the present invention. The (meth)acrylate monomers and oligomers can be present in amounts up to 50% by weight of the compositions and preferably have equivalent weights ranging from about 250 to 5000 and average functionalities from about 1 to 4. Higher molecular weight (meth)acrylates are preferred because they are less toxic.

The term "(meth)acrylate" and various grammatical forms thereof, identifies esters that are the reaction product of acrylic or methacrylic acid with a hydroxy group-containing compound.

The (meth)acrylate oligomers suitable for use in the present invention contain an average of at least 1.0, preferably at least about 1.2, and more preferably about 2 to about 4, (meth)acrylate groups per oligomer.

These (meth)acrylate oligomers are illustrated by Cargill 1570, a diacrylate ester of Bisphenol A epichlorohydrin epoxide resin having a number average molecular weight of about 700 daltons that is commercially available from Cargill, Carpentersville, Ill.

The (meth)acrylate oligomer can be a poly(meth)acrylate of an epoxy functional resin. These poly(meth)acrylates preferably contain an average of more than about two (meth)acrylate groups per oligomer and are exemplified by the commercial product Ebecryl 3700 available from Radcure Specialties, Inc., Louisville, Ky., which is the diester of Epon 828 and acrylic acid. Epon 828 is an epoxy functional resin that is a diglycidyl ether of Bisphenol A that is commercially available from Shell Chemicals, New York, N.Y. The number average molecular weight of Ebecryl 3700 is about 500 daltons and of Epon 828 is about 390 daltons.

(Meth)acrylate-modified polyurethanes are also useful as the (meth)acrylate oligomers, especially those that employ a polyester base. Particularly preferred are acrylate-capped polyurethanes that are the urethane reaction products of a hydroxy-functional polyester, especially one having an average of about 2 to about 5 hydroxy groups per molecule, with a monoacrylate monoisocyanate. These acrylate-capped polyurethanes are illustrated by a polyester made by reacting trimethylol propane with a caprolactone to a number average molecular weight of about 600 daltons followed by reaction with three molar proportions of the reaction product of 1 mol of 2-hydroxyethyl acrylate with 1 mol of isophorone diisocyanate. The end product is a polyurethane triacrylate. The urethane-forming reaction is conventionally performed at about 60° C. in the presence of about 1 percent by weight of dibutyltin dilaurate.

A commercial, polyester-based polyacrylate-modified polyurethane that is useful herein is Uvithane 893 available from Thiokol Chemical Corp., Trenton, N.J. The polyester in the Uvithane 893 product is a polyester of adipic acid with about 1.2 molar proportions of ethylene glycol polyesterified to an acid number of less than about 5. This polyester is converted as described above to a polyacrylate-modified polyurethane that is a semisolid at room temperature and that has an average unsaturation equivalent of about 0.15 to about 0.175 acrylic double bonds per 100 grams of resin.

In polyester processing, the acid number, defined as the number of milligrams of base required to neutralize one gram of polyester, is used to monitor the progress of the reaction. The lower the acid number, the further the reaction has progressed.

A polyacrylate-modified polyurethane that is suitable as the (meth)acrylate oligomer is the reaction product of 1 mol of diisocyanate, 1 mol of 2-hydroxyethyl acrylate (HEA) and about 1 weight percent dibutyltin dilaurate reacted at a temperature of about 40° C. for a time period of 4 hours that is subsequently reacted at a temperature of about 60° C. for a time period of about 2 hours with 1 mol of a commercial hydroxy end-functional caprolactone polyester. A suitable caprolactone polyester is the reaction product of 2 mols caprolactone and 1 mol of ethylene glycol reacted at a temperature of about 60° C. for a time period of 4 hours. A suitable commercial caprolactone polyester is available from Union Carbide Corp., Danbury, Conn., under the trade designation Tone M-100 which has a number average molecular weight of about 345 daltons.

The number average molecular weight of the (meth)acrylate oligomers is preferably about 500 to about 15,000, more preferably about 1200 to about 6000,daltons.

The equivalent weight of the (meth)acrylate oligomers is preferably about 250 to about 5000, more preferably about 600 to about 3000.

Component Containing Vinyl Ether and Maleate and/or Fumarate Groups

The present invention is also directed to the use of compounds in the compositions of the present invention. The compounds can be utilized in the compositions of the present invention. These compounds can be represented by the following Formula I:

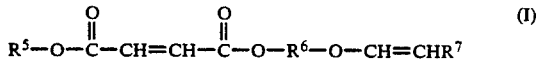

where $R^5$ is hydrogen, alkyl, cycloalkyl, an aryl or alkaryl group with 1 to 10 carbon atoms and at least one optional O or N heteroatom, or a metal ion; $R^6$ is alkyl, cycloalkyl, or an aryl or alkaryl group with to 10 carbon atoms and at least one optional O or N heteroatom; and $R^7$ is hydrogen or methyl.

Conventional Diluents

Other monomers that are known to be used in free radical curable compositions such as N-vinyl pyrrolidinone, N-vinyl imidazole, 2-vinyl pyridine, N-vinyl carbazole, N-vinyl caprolactam, the like, and mixtures thereof can be added to the compositions of the present invention.

Preferred Compositions

The present compositions preferably contain at least one compound containing from one to about six vinyl ether groups in an amount in the range of about 0 to about 80, more preferably about 20 to about 70, weight percent based on the total weight of the composition.

The present compositions preferably contain at least one product obtainable by the reaction of a half-ester of maleic and/or fumaric acid with an epoxy functionalized compound in an amount in the range of about 0 to about 80, more preferably about 20 to about 70, weight percent based on the total weight of the composition.

The present compositions preferably contain the compounds of Formula I in an amount in the range of about 0 to about 80, more preferably about 0 to about 30, weight percent based on the total weight of the composition.

The viscosity of the present compositions at a temperature of 25° C. is preferably about 50 to about 25,000, more preferably about 50 to about 15,000, centipoise (cP) and is adjusted to enhance the use of the compositions.

The compositions of the present invention are preferably solvent free and can contain from about 0.1 to about 40 percent by weight of conventional additives such as pigments, fillers, stabilizers and wetting agents.

Curing of the Compositions

The compounds and compositions of the present invention can be cured upon exposure to energy such as ionizing radiation, actinic energy, i.e., ultraviolet and visible light, and heat, i.e., thermal cure.

Conventional ionizing radiation sources include electron beam devices. The amount of ionizing radiation required for cure of a 3 mil thick film is about 1 to about 30 megarads.

When cure of the compounds or compositions of the present invention is by exposure to actinic energy of appropriate wavelength, such as ultraviolet light, a photoinitiator can be admixed with the monomer or composition. It is desirable to select the photoinitiator from the group consisting of (1) hydroxy- or alkoxy-functional acetophenone derivatives, preferably hydroxyalkyl phenones, or (2) benzoyl diaryl phosphine oxides. Formulations containing the two different types of ethylenic unsaturation, i.e., the vinyl ether group and the maleate or fumarate group, copolymerize rapidly in the presence of the specified groups of photoinitiators to provide a rapid photocure and also interact rapidly upon exposure to other types of energy such as electron beams or gamma radiation when no polymerization initiator is present.

Maleate or fumarate compounds by themselves respond poorly to photocure using, for example, ultraviolet light when the photoinitiator is an ordinary aryl ketone photoinitiator, such as benzophenone. Also, vinyl ethers do not exhibit any substantial curing response to ultraviolet light when these aryl ketone photoinitiators are utilized. Nonetheless, maleate/fumarate terminated compounds and vinyl ethers in admixture respond to the photocure very rapidly when the photoinitiator is correctly selected. The photocure, and the cure upon exposure to other types of energy such as electron beams or gamma radiation when no initiator is present, is especially rapid and effective when both of the described types of unsaturation are provided in polyfunctional compounds, particularly those of resinous character. The fastest cures are obtained when the respective functionalities are present in about the same equivalent amount.

Preferably the photoinitiators are (1) hydroxy- or alkoxy-functional acetophenone derivatives, more preferably hydroxyalkyl phenones, and (2) benzoyl diaryl phosphine oxides.

The acetophenone derivatives that may be used have the Formula VI:

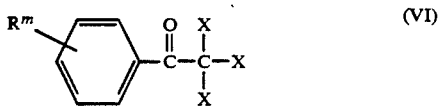
(VI)

in which $R^m$ is an optional hydrocarbon substituent containing from 1 to 10 carbon atoms and which may be alkyl or aryl, e.g., methyl, ethyl, butyl, octyl or phenyl, X is selected from the group consisting of hydroxy, $C_1$ to $C_4$ alkoxy, $C_1$ to $C_8$ alkyl, cycloalkyl, halogen, and phenyl, or 2 Xs together are cycloalkyl, and at least one X is selected from the group consisting of hydroxy and $C_1$ to $C_4$ alkoxy.

Many compounds have the required structure. The alkoxy groups are preferably methoxy or ethoxy, the alkyl group is preferably methyl or ethyl, the cycloalkyl group is preferably cyclohexyl, and the halogen is preferably chlorine. One commercially available compound is the Ciba-Geigy product Irgacure 651 which has the Formula VII:

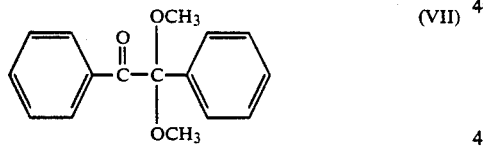
(VII)

Irgacure 184, also from Ciba-Geigy, is another useful acetophenone derivative, and it has the Formula VIII:

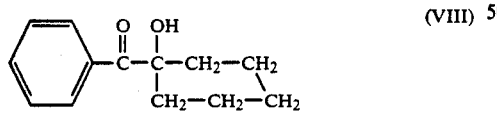
(VIII)

Still another commercially available useful acetophenone derivative is diethoxy acetophenone, available from Upjohn Chemicals, North Haven, Conn., which has the Formula IX:

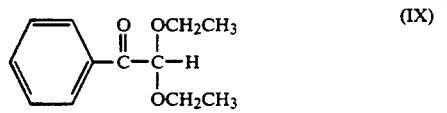
(IX)

When the photoinitiator is a hydroxy-functional compound, one can define the useful acetophenone derivatives in a somewhat different manner. Thus, the hydroxyalkyl phenones which are preferred herein have the Formula X:

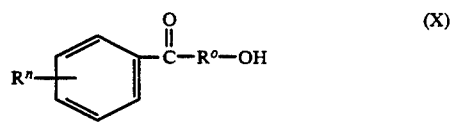
(X)

in which $R^o$ is an alkylene group containing from 2–8 carbon atoms and $R^n$ is an optional hydrocarbon substituent containing from 1 to 10 carbon atoms and which may be alkyl or aryl, e.g., methyl, ethyl, butyl, octyl or phenyl.

It is particularly preferred that the hydroxy group be in the 2-position in which case it is preferably a tertiary hydroxy group which defines a hydroxy group carried by a carbon atom that has its remaining three valences connected to other carbon atoms. Particularly preferred compounds have the Formula XI:

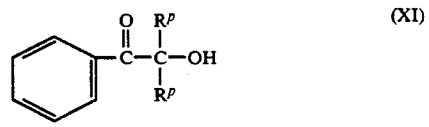
(XI)

in which each $R^p$ is independently an alkyl group containing from 1 to 4 carbon atoms. In the commercial product Darocur 1173 (available from E-M Company, Hawthorne, N.Y.), each $R^p$ is methyl. This provides a compound which can be described as 2-hydroxy-2-methyl-1-phenyl propane 1-one. The "propane" is replaced by butane or hexane to describe the corresponding compounds, and these will further illustrate preferred compounds in this invention.

The benzoyl diaryl phosphine oxide photoinitiators which may be used herein have the Formula XII:

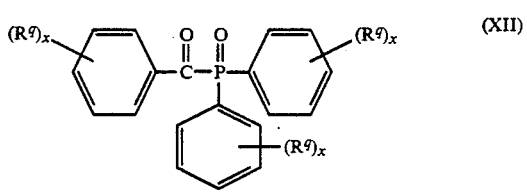
(XII)

In Formula XII, $R^q$ is an optional hydrocarbon substituent containing from 1 to 10 carbon atoms and may be alkyl or aryl as previously noted, and each x is independently an integer from 1 to 3. In preferred practice, a 2,4,6-trimethyl benzoyl compound is used, and the two aromatic groups connected to the phosphorus atom are phenyl groups. This provides the compound 2,4,6-trimethyl benzoyl diphenyl phosphine oxide which is available from BASF under the trade designation Lucirin TPO.

When utilized, the photoinitiator is preferably present in an amount in the range of about 0.01 to about 10.0, more preferably about 0.1 to about 6.0, weight percent based on the total weight of the composition.

Suitable sources of actinic energy include lasers and other conventional light sources having an effective energy output, e.g., mercury lamps.

The wavelength of the actinic energy extends from the ultraviolet range, through the visible light range and into the infrared range. Preferred wavelengths are about 200 to about 2,000, more preferably about 250 to about 1,000, nanometers (nm).

The amount of actinic energy utilized to solidify a 3 mil thick film is about 0.05 to about 5.0, preferably about 0.1 to about 1 Joules per square centimeter (J/sqcm).

The monomers and compositions also can be thermally cured in the presence of a conventional thermal free-radical initiator, e.g., benzoyl peroxide, cyclohexanone peroxide N,N-azobis(isobutyrylnitrite), metallic dryer systems, redox systems, and the like.

The free-radical curable monomers and compositions of the present invention can be utilized, as coatings (especially as primary and secondary optical glass fiber coatings), in a metallization process wherein a non-metallic substrate is provided with a metal finish, to produce objects utilizing an optical fabrication process as described in U.S. Pat. No. 4,575,330 to Hull, in composite materials and other applications.

The following Examples are presented by way of representation, and not limitation, of the present invention.

EXAMPLE 1

Preparation of Curable Compositions Based Upon Maleate Terminated Bisphenol A Epoxy Resin A maleate terminated epoxy resin was synthesized by the procedure in which a mixture of 5,230.8 grams of butyl cellosolve and 4,345.2 grams of maleic anhydride were heated in a 22 liter flask equipped with a stirrer, nitrogen inlet, thermometer, snyder column and condenser. At 60° C. an exothermic reaction took place and the temperature rose to 120° C. where it was held for 90 minutes. The acid value at this point was 260.1 (theoretical 260). Then 8,361.5 grams of Epon 828 (diglycidyl ether Bisphenol A available from Shell Chemical) and 18.0 grams of benzyl trimethyl ammonium chloride were added and heating was continued at 130° C. for about 12 hours. The final epoxy-maleate product had an acid value of 15.0, Gardner color of 3–4, Brookfield viscosity of 443,200 and a weight per gallon of 9.51.

The above epoxy-maleate resin (79 grams) was blended with 21 grams of Rapi-Cure DVE-3 (triethylene glycol divinyl ether available from ISP Corp.) and 5 grams of Darocur 1173 (Ciba-Geigy). Curing of a 1 mil film on glass with UV light from a Mercury lamp showed a minimum cure dose of 0.4 J/cm$^2$ in air (>200 MEK double rubs) and <0.2 J/cm$^2$ in nitrogen (169 MEK double rubs). After curing at 2 J/cm$^2$ this coating had >200 MEK double rubs and a pencil hardness of HB.

The above epoxy-maleate resin (79 grams) was blended with 21 grams of Rapi-Cure DVE-3 and 3 grams of Darocur 1173. A three mil film cured at 2 J/cm$^2$ had a tensile strength of 15.1 MPa, an elongation of 5.1% and a modulus of 481 MPa.

The above epoxy-maleate resin (77 grams) was blended with 20 grams of Rapi-Cure CHVE (cyclohexanedimethanol divinyl ether: ISP Corp) and 3 grams of Darocur 1173. A three mil film cured at 2 J/cm$^2$ had a pencil hardness of HB, tensile strength of 11 MPa, an elongation of 14% and a modulus of 193 MPa.

The above epoxy-maleate resin (79 grams) was blended with 21 grams of Rapi-cure DVE-3 and 5 grams of Irgacure 184 (Ciba-Geigy). Curing of a 1 mil film on glass with UV light showed a minimum cure dose of 1.0 J/cm$^2$ in air (>200 MEK double rubs) and <0.2 J/cm$^2$ in nitrogen (93 MEK double rubs).

The above epoxy-maleate resin (79 grams) was blended with 21 grams of Rapi-Cure DVE-3 and 5 grams of Irgacure 651 (Ciba-Geigy). Curing of a 1 mil film on glass with UV light showed a minimum cure dose of 1.0 J/cm$^2$ in air (>200 MEK double rubs) and <0.2 J/cm$^2$ in nitrogen (25 MEK double rubs).

The above epoxy-maleate resin (79 grams) was blended with 21 grams of Rapi-Cure DVE-3 and 5 grams of Lucerin TPO (BASF). Curing of a 1 mil film on glass with UV light showed a minimum cure dose of 1.0 J/cm$^2$ in air (>200 MEK double rubs) and <0.2 J/cm$^2$ in nitrogen (>200 MEK double rubs).

The above epoxy-maleate resin (79 grams) was blended with 21 grams of Rapi-Cure DVE-3. Curing of 1 mil films with electron beam radiation gave the following results:

| Dose (Mrads) | MEK Double Rubs |
| --- | --- |
| 2.0 | 60 |
| 4.0 | 86 |
| 8.0 | 131 |
| 12.0 | >200 |
| 16.0 | >200 |

EXAMPLE 2

Free Radical Curable Compositions Based on Maleate Terminated Cycloaliphatic Epoxy Resin A mixture of 123 grams of butyl cellosolve and 98 grams of maleic anhydride were heated to 120° C. and held for 2 hours. Then 126 grams of ERL 4221 (cycloaliphatic epoxy resin available from Union Carbide) and 0.5 grams of benzyl trimethyl ammonium chloride were added and the mixture was heated at 130° C. for about 14 hours. The resultant epoxy-maleate product had an acid value of 60.4, a Gardner color of 10–11 and a theoretical equivalent weight of 342.

The epoxy-maleate product of the above reaction (34.2 grams) was mixed with 9.3 grams of Rapi-Cure DVE-3, 0.89 grams of BHT (butylated hydroxy toluene) and 1.32 grams of Darocur 1173. The formulation had a Brookfield viscosity of 3,200 cP. The minimum UV cure dose in air was 1.5 J/cm$^2$ and the minimum cure dose in nitrogen was 0.25 J/cm$^2$. A cured film had a pencil hardness of H.

EXAMPLE 3

Free Radical Curable Composition Based on Maleate Terminated Cycloaliphatic Epoxy Resin A mixture of 123 grams of butyl cellosolve and grams of maleic anhydride were heated to 120° C. and held for 2 hours. Then 126 grams of ERL 4221 and 0.5 grams of benzyl trimethyl ammonium chloride were added and the mixture was heated at 130° C. for about 14 hours. The resultant epoxy-maleate product had an acid value of 30.4 and a theoretical equivalent weight of 342.

The epoxy-maleate product of the above reaction (34.2 grams) was mixed with 9.3 grams of Rapi-Cure DVE-3, 0.89 grams of BHT and 1.32 grams of Darocur 1173. The formulation had a Brookfield viscosity of 4,300 cP. The minimum cure dose in air was 1.5 J/cm$^2$ and the minimum cure dose in nitrogen was 0.25 J/cm$^2$. A cured film had a pencil hardness of H.

EXAMPLE 4

Preparation of Curable Composition Based on Maleate Terminated Bisphenol F Epoxy Resin A mixture of 247.5 grams of butyl cellosolve and 196 grams of maleic anhydride were heated to 120° C. and held for 2.5 hours. Then 352 grams of Epalloy 8230 (disphenol F epoxy resin) (CVC Specialty Chemical) and 1.0 grams of benzyl trimethyl ammonium chloride were added and the mixture was heated at 130° C. for about 10 hours. The resultant epoxy-maleate product had an acid value of 18.5, a Gardner color of 8-9, a Brookfield viscosity of 1,556,000 and a theoretical equivalent weight of 431.

The epoxy-maleate product of the above reaction (43.1 grams) was mixed with 9.1 grams of DVE-3, 1.1 grams of BHT and 1.60 grams of Darocur 1173. The formulation had a Brookfield viscosity of 11,580 cP. The minimum UV cure dose in air was 1.0 J/cm$^2$ and the minimum cure dose in nitrogen was 0.21 J/cm$^2$. A cured film had a pencil hardness of 2B.

EXAMPLE 5

Preparation of Vinyl Ether Terminated Resin

A vinyl ether terminated resin was prepared by reacting 543.9 grams of Adiprene L-200 (urethane prepolymer) (% NCO=7.47%: Uniroyal Chemical) with 56.1 grams of hydroxybutyl vinyl ether (Rapi-Cure HBVE; ISP Corp) in the presence of 0.24 grams of dibutyl tin dilaurate. The reaction took about 36 hours at 60°-70° C. to reach a level of no residual isocyanate as measured by the di-n-butylamine method. The resultant product had a Brookfield viscosity of 121,000 cP, a Gardner color of 1, a refractive index of 1.5110 and a weight per gallon of 8.80.

EXAMPLE 6

Preparation of Coating Composition

A coating formulation was prepared by blending 19.3 grams of the epoxy-maleate resin of Example 1, 33.9 grams of the vinyl ether terminated resin of Example 5, 0.27 grams of a light stablizer, 0.27 grams of a antioxidant and 2.66 grams of Darocur 1173. A 1 mil film on glass was tack free and did not smudge when wiped with a paper tissue after exposure to a dosage of 0.2 J/cm$^2$. A 1 mil film obtained upon exposure to a dosage of 2.0 J/cm$^2$ was flexible and tough.

EXAMPLE 7

Preparation of Curable Composition Based on Maleate Terminated Aliphatic Epoxy Compound A mixture of 118 grams of butyl cellosolve and grams of maleic anhydride were heated to 120° C. and held for 2 hours. Then 116 grams of Araldite RD-2 (diglycidyl ether of butane diol available from Ciba-Geigy) and 0.3 grams of benzyl trimethyl ammonium chloride were added and the mixture was heated at 130° C. for about 12 hours. The resultant epoxy-maleate product had a theoretical equivalent weight of 317, an acid value of 33.5 and a Brookfield viscosity of 2800 cP.

The epoxy-maleate product of the above reaction (75.8 grams) was mixed with 24.2 grams of DVE-3 and 4.0 grams of Darocur 1173. The formulation had a Brookfield viscosity of 415 cP. A film cured at 0.5 J/cm$^2$ in nitrogen gave >200 MEK double rubs and had a pencil hardness of HB. Mechanical property measurements on a 1 mil film cured at 2 J/cm$^2$ showed a tensile strength of 3.4 MPa, an elongation of 5% and a modulus of 80 MPa.

EXAMPLE 8

Evaluation of Compositions

A mixture of 96 grams of butyl cellosolve and 79.7 grams of maleic anhydride was heated to 120° C. and held for 2 hours. Then 20.5 grams of Araldite RD-2, 103.8 grams of Epon 828 and 0.3 grams of benzyl trimethyl ammonium chloride were added and the mixture was heated at 130° C. for about 12 hours. The resultant epoxy-maleate product had a theoretical equivalent weight of 369.

The epoxy-maleate product of the above reaction (88.0 grams) was mixed with 12.0 grams of DVE-3 (a 2:1 ratio of maleate double bonds to vinyl ether double bonds) and 4.0 grams of Darocur 1173. The formulation had a Brookfield viscosity of 22,150 cP. A film cured at 0.50 J/cm$^2$ in nitrogen gave 97 MEK double rubs and had a pencil hardness of H.

The epoxy-maleate product of the above reaction (78.5 grams) was mixed with 21.5 grams of DVE-3 (a 1:1 ratio of maleate double bonds to vinyl ether double bonds) and 4.0 grams of Darocur 1173. The formulation had a Brookfield viscosity of 4340 cP. A film cured at 0.5 J/cm$^2$ in nitrogen gave >200 MEK double rubs and had a pencil hardness of H.

The epoxy-maleate product of the above reaction (71.9 grams) was mixed with 29.1 grams of DVE-3 (a 2:3 ratio of maleate double bonds to vinyl ether double bonds) and 4.0 grams of Darocur 1173. The formulation had a Brookfield viscosity of 1620 cP. A film cured at 0.5 J/cm$^2$ in nitrogen gave >200 MEK double rubs and had a pencil hardness of 3H.

The epoxy-maleate product of the above reaction (78.5 grams) was mixed with 21.5 grams of DVE-3. A film coated on high gloss test paper using a #40 wire wound rod and electron beam cured at 5 Megarads gave a cheesey film with >200 MEK double rubs.

EXAMPLE 9

Wood Coating Composition

A coating for wood was prepared with the epoxy-maleate resin from Example 8. The formulation is shown below:

| | |
|---|---|
| Epoxy-maleate from Example 8 | 60.8% |
| Diethyl Fumarate | 14.2% |
| DVE-3 | 25.0% |
| Darocur 1173 | 04.0% |
| Phenothiazine | 00.1% |

Test results from above formulation:

| | |
|---|---|
| MEK double rubs at 1 J/cm$^2$ | >200 |
| MEK double rubs at 0.5 J/cm$^2$ | >200 |
| Adhesion to wood | Good |
| Pencil hardness | H |
| Gardner color | 9 |
| Gloss 60° C. (paper) | 89 |
| Viscosity (cP) | 330 |
| Stain Resistace (10 = best) | |
| Ethanol (30 min) | 9 |
| Nail Polish remover (30 min) | 10 |
| Wisk (24 hours) | 9 |
| Ketchup (24 hours) | 10 |

| -continued | |
|---|---|
| Mustard (24 hours) | 1 |

EXAMPLE 10

Coating Compositions with Varying Ratios of Maleate Double Bonds to Vinyl Ether Double Bonds A mixture of 43.4 grams of butyl cellosolve and 36.0 grams of maleic anhydride were heated to 120° C. and held for 2 hours. Then 62.5 grams of Epon 828 and 0.2 grams of benzyl trimethyl ammonium chloride were added and the mixture was heated at 130° C. for about 3 hours. Then 58.1 grams of tert-butyl acetoacetate was added and the reaction was heated to 175° C. and tert-butyl alcohol was removed over a 6 hour period. The resultant epoxy-maleate product had an acid value of 30.1 and a viscosity of 143,000 cP.

Several formulations were made to evaluate the ratio of maleate double bonds to vinyl ether double bonds. These are shown below:

| Component | I | II | III |
|---|---|---|---|
| Epoxy maleate resin of this Example | 90.3 | 82.2 | 75.6 |
| Rapi-Cure DVE-3 | 9.7 | 17.7 | 24.4 |
| Darocur 1173 | 4.9 | 4.0 | 4.0 |
| Maleate to Vinyl Ether Ratio | 2:1 | 1:1 | 2:3 |
| Viscosity (cP) | 15,575 | 4420 | 2025 |
| MEK Double Rubs (1 J/cm$^2$) | 44 | 156 | 78 |
| MEK Double Rubs (2 J/cm$^2$) | 150 | >200 | 148 |
| Pencil Hardness (2 J/cm$^2$) | 4B | HB | B |

EXAMPLE 11

Curable Composition Containing Maleate Terminated Rubber Modified Epoxy Resin A mixture of 191.0 grams of butyl cellosolve and 154.5 grams of maleic anhydride were heated to 120° C. and held for 2 hours. Then 275.0 grams of Epon 828, 129.5 grams of Hycar CTBN 1300X13 (carboxy terminated polybutadiene nitrile rubber available from BF Goodrich) and 0.75 grams of benzyl trimethyl ammonium chloride were added and the mixture was heated at 120° C. for about 7 hours. The resultant epoxy-maleate product had an acid value of 36.7.

The above epoxy-maleate (82.1 grams), Rapi-Cure DVE-3 (17.9 grams) and 4.0 grams of Darocur 1173 were mixed. The viscosity of the formulation was 68,000 cP. A 1 mil film cured at 0.5 J/cm$^2$ had >200 MEK double rubs.

We claim:

1. A free-radical radiation curable composition comprising:
   a) at least one compound containing from one to about six vinyl ether groups; and
   b) at least one maleate or fumarate terminated product obtained by the reaction of a half-ester of maleic acid and/or fumaric acid with a polyepoxy functionalized compound,
   wherein the ratio of vinyl ether groups to maleate and/or fumarate groups is in the range of about 2:1 to about 1:2.

2. The composition of claim 1 wherein the epoxy compound used to make product b) is obtained from an epoxy compound that has an epoxy equivalent weight of about 80 to about 1000.

3. The composition of claim 2 wherein the epoxy compound has an epoxy equivalent weight in a range of about 150 to 250.

4. The composition of claim 2 wherein the epoxy compound is a polyglycidyl ether of an aromatic polyol.

5. The composition of claim 2 wherein the epoxy compound is a diglycidyl ether of bisphenol-A.

6. The composition of claim 2 wherein the epoxy compound is a polyglycidyl ether of a novolac phenolic or cresol resin.

7. The composition of claim 2 wherein the epoxy compound is a polyglycidyl ether of an aliphatic polyol with 4 to 10 carbon atoms.

8. The composition of claim 2 wherein the epoxy compound is cycloaliphatic with 6 to 20 carbon atoms.

9. The composition of claim 1 wherein the ratio of maleic and/or fumaric half-ester to epoxy groups reacted together to form the product is about 0.5 to about 2.0.

10. The composition of claim 1 wherein the maleate and/or fumarate half-ester has the formula:

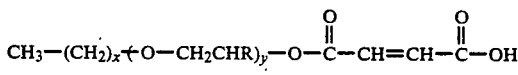

where
x is 0 to 5;
y is 0 to 3; and
R is H or methyl.

11. The composition of claim 1 wherein the vinyl ether compound has the formula:

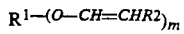

wherein m is an integer from 1 to 6;
R$^1$ is the residue of an organic alcohol or polyol, substantially free of maleate or fumarate groups, with a molecular weight of from 56 to 2000; and
R$^2$ is hydrogen or methyl.

12. The composition of claim 11 wherein the value of m is 2 to 4.

13. The composition of claim 1 where the ratio of vinyl ether to maleate and/or fumarate groups is about 1:1.

14. The composition of claim 1 that further comprises 0.1 to 10 weight percent based on the total weight of the composition of at least one free radical photoinitiator.

15. The composition of claim 1 where the photoinitiator is

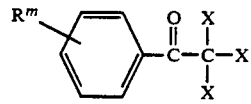

where R$^m$ is an optional alkyl or aryl hydrocarbon substituent containing from 1 to 10 carbon atoms; and
x is selected from the group consisting of hydroxy, C$_1$ to C$_4$ alkoxy, C$_1$ to C$_8$ alkyl, cycloalkyl, halogen, and phenyl, or 2 Xs together are cycloalkyl, and at least one X is selected from the group consisting of hydroxy and C$_1$ to C$_4$ alkoxy.

16. The composition of claim 1 where the photoinitiator is

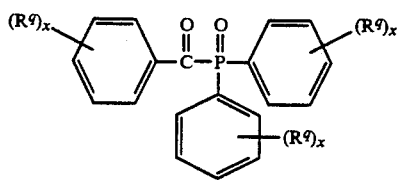

where $R^q$ is an optional hydrocarbon substituent containing from 1 to 10 carbon atoms; and x is independently an integer from 1 to 3.

17. The composition of claim 1 that also includes up to 50 weight percent based on the total weight of the composition of acrylate or methacrylate terminated monomers or oligomers with molecular weights ranging from about 250 to 5000 and average functionalities from about 1 to 4.

18. The composition of claim 1 which also contains up to 80 weight percent based on the total weight of the composition of a compound of the formula:

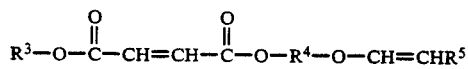

where $R^3$ is selected from the group consisting of:
a) alkyl, cycloalkyl, aryl or alkaryl groups, with 1 to 10 carbon atoms and can contain O or N heteroatoms,
b) H, or
c) metal ions;

$R^4$ is selected from the group consisting of alkyl, cycloalkyl, aryl or alkaryl groups with 1 to 10 carbon atoms and can contain O or N heteroatoms; and $R^5$ is H or methyl.

19. The composition of claim 1 that further comprises from about 0.1 to about 40 weight percent based on the total weight of the composition of at least one additive selected from the group consisting of pigments, fillers, wetting agents, stabilizers and mixtures thereof.

20. The composition of claim 1 where the vinyl ether compound is triethyleneglycol divinyl ether.

21. The composition of claim 1 where the vinyl ether compound is 1,4-cyclohexane dimethanol divinyl ether.

22. The composition of claim 1 wherein the vinyl ether compound is a vinyl ether urethane oligomer.

23. A substrate coated with a composition of claim 1.

24. A substrate coated with a cured composition of claim 1.

25. The coated substrate in accordance with claim 23 or 24 wherein the substrate is selected from the group of glass, paper, wood, rubber, metal, concrete, leather, fabric, fiber and plastic.

26. A free-radical radiation curable composition comprising:

a) at least one vinyl ether compound of the formula:

where m is an integer from 1 to 6; $R^1$ is the residue of an organic alcohol or polyol with a molecular weight of from 56 to 2,000; and $R^2$ is hydrogen or methyl;

b) at least one product obtained by the reaction of a maleate or fumurate half-ester of the formula:

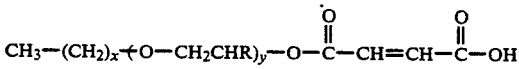

where
x is 0 to 5;
y is 0 to 3; and
R is H or methyl with a polyepoxy functionalized compound,
wherein the ratio of vinyl ether groups to maleate and/or fumarate groups is in the range of about 2:1 to about 1:2.

* * * * *

UNITED STATES PATENT AND TRADEMARK OFFICE
CERTIFICATE OF CORRECTION

PATENT NO. : 5,334,455
DATED : August 2, 1994
INVENTOR(S) : Noren et al.

It is certified that error appears in the above-indentified patent and that said Letters Patent is hereby corrected as shown below:

Column 5, line 57, delete [his-] and insert --bis--.

Column 6, line 8, delete $[CH_3-(CH_2)_x(O-CH_2CHR)_y-O-\overset{O}{\underset{\|}{C}}-CH=CH-\overset{O}{\underset{\|}{C}}-OH]$ and insert $--CH_3-(CH_2)_x-(-O-CH_2CHR)_y-O-\overset{O}{\underset{\|}{C}}=CH-\overset{O}{\underset{\|}{C}}-OH--$.

Column 11, line 66, delete [Rapi-cure] and insert --Rapi-Cure--.

Column 13, line 53, delete [and grams] and insert --and 98 grams--.

Column 14, line 64, delete [Stain Resistace] and insert --Stain Resistance--.

Column 16, line 25, delete $[CH_3-(CH_2)_x(O-CH_2CHR)_y-O-\overset{O}{\underset{\|}{C}}-CH=CH-\overset{O}{\underset{\|}{C}}-OH]$ and insert $--CH_3-(CH_2)_x-(-O-CH_2CHR)_y-O-\overset{O}{\underset{\|}{C}}=CH-\overset{O}{\underset{\|}{C}}-OH--$.

Column 16, line 35, delete $[R^1-(O-CH=CHR2)_n]$ and insert $--R^1-(O-CH=CHR^2)_n--$.

UNITED STATES PATENT AND TRADEMARK OFFICE
CERTIFICATE OF CORRECTION

PATENT NO. : 5,334,455
DATED : August 2, 1994
INVENTOR(S) : Noren et al.

It is certified that error appears in the above-indentified patent and that said Letters Patent is hereby corrected as shown below:

Column 17, line 28, delete [R]is] and insert --$R^3$ is--.

Column 18, line 31, delete $[CH_3-(CH_2)_x(O-CH_2CHR)_y-O-\overset{O}{\underset{\|}{C}}-CH=CH-\overset{O}{\underset{\|}{C}}-OH]$ and insert --$CH_3-(CH_2)_x-(-O-CH_2CHR)_y-O-\overset{O}{\underset{\|}{C}}=CH-\overset{O}{\underset{\|}{C}}-OH$--.

Signed and Sealed this

Twenty-second Day of November, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,334,455
DATED : August 2, 1994
INVENTOR(S) : Noren et al.

It is certified that error appears in the above-indentified patent and that said Letters Patent is hereby corrected as shown below:

Column 7, line 66, delete [with to 10] and insert —with 1 to 10—.
Column 12, line 55, after "and" insert —98—.
Column 13, line 53, after "and" insert —98—.

Signed and Sealed this

Seventeenth Day of January, 1995

BRUCE LEHMAN

Attest:

Attesting Officer        Commissioner of Patents and Trademarks